(12) United States Patent
Chang

(10) Patent No.: US 12,707,703 B2
(45) Date of Patent: Aug. 11, 2026

(54) SEMICONDUCTOR STRUCTURE AND METHOD FOR FABRICATING THE SAME

(71) Applicant: UNITED MICROELECTRONICS CORP., Hsinchu (TW)

(72) Inventor: Kai-Kuen Chang, Hsinchu City (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 415 days.

(21) Appl. No.: 18/204,644

(22) Filed: Jun. 1, 2023

(65) Prior Publication Data

US 2024/0355893 A1 Oct. 24, 2024

(30) Foreign Application Priority Data

Apr. 18, 2023 (TW) ................................ 112114382

(51) Int. Cl.

| | |
|---|---|
| ***H10D 64/27*** | (2025.01) |
| ***H10D 30/01*** | (2025.01) |
| ***H10D 30/63*** | (2025.01) |
| ***H10D 84/83*** | (2025.01) |

(52) U.S. Cl.

CPC ......... *H10D 64/516* (2025.01); *H10D 30/021* (2025.01); *H10D 30/637* (2025.01); *H10D 84/83* (2025.01)

(58) Field of Classification Search

CPC ............. H10D 30/021; H10D 84/0123; H10D 84/0144; H10D 84/0181; H10D 30/022; H10D 30/0227; H10D 30/601; H10D 64/661; H10D 64/691; H10D 64/518; H10D 84/0179; H10D 84/856; H10D 64/514–516; H10D 30/0285; H10D 30/0289; H10D 30/608; H10D 84/83138; H10D 84/8314

See application file for complete search history.

(56) References Cited

U.S. PATENT DOCUMENTS

| | | | | |
|---|---|---|---|---|
| 11,640,981 | B2 | 5/2023 | Li | |
| 2004/0198009 | A1* | 10/2004 | Chen ................. | H10D 84/0144 257/E21.639 |
| 2006/0043493 | A1* | 3/2006 | Uchiyama .......... | H10D 84/0177 257/E21.639 |

(Continued)

OTHER PUBLICATIONS

Saha, J. & Chakma, Nitish & Hasan, Mehedhi. (2016). Impact of scaling channel length on the performances of nanoscale FETs. 123-126. 10.1109/ICECE.2016.7853871. (Year: 2016).*

*Primary Examiner* — Julio J Maldonado
*Assistant Examiner* — Eric Manuel Mulero Flores
(74) *Attorney, Agent, or Firm* — WPAT, PC

(57) ABSTRACT

A semiconductor structure includes a substrate and a first switch element disposed in a first device area of the substrate. The first switch element includes a channel region, a first gate dielectric layer, a first gate layer and a source/drain region. The channel region is disposed at the bottom of a recess in the first device area. The first gate dielectric layer has a first region and a second region extending into the recess, the first region has a first thickness; the second region has a second thickness, and the first thickness is smaller than the second thickness. The first gate layer is disposed above the first gate dielectric layer. The source/drain region is disposed in the substrate and adjacent to the first gate dielectric layer.

20 Claims, 12 Drawing Sheets

(56) References Cited

U.S. PATENT DOCUMENTS

2007/0218638 A1* 9/2007 Wang .................. H10D 64/516
257/E29.054
2009/0039444 A1* 2/2009 Suzuki ................ H10D 64/258
257/E27.06
2010/0072545 A1* 3/2010 Ryu .................... H10D 30/024
257/334
2011/0284952 A1* 11/2011 Oga .................... H10D 64/027
438/270
2016/0056233 A1* 2/2016 Mitsuiki ............... H10D 84/83
257/401
2018/0269110 A1* 9/2018 Chang ................ H01L 21/2652
2022/0085048 A1* 3/2022 Lee ....................... H10B 43/40
2022/0102518 A1* 3/2022 Chen ................... H10D 64/516

* cited by examiner

SEMICONDUCTOR STRUCTURE AND METHOD FOR FABRICATING THE SAME

This application claims the benefit of Taiwan Application Serial No. 112114382 filed at Apr. 18, 2023, the subject matter of which is incorporated herein by reference.

BACKGROUND

Technical Field

The disclosure relates to an integrated circuit (IC) and method for fabricating the same, and more particularly to a semiconductor structure and method for fabricating the same.

Description of Background

With the development of IC technology, a composite semiconductor structure with different switching elements has become one of the important structures for forming an IC. In the composite semiconductor structure, different switching elements that require different threshold voltage for different applications can be satisfied by various designing with different structures and sizes. However, it is difficult to manufacture the switching elements having different structures and sizes, by a single process.

To take a composite semiconductor structure having a plurality of transistors with different threshold voltages as an example, theses transistors require gate dielectric layers with different thicknesses; and different lithographic etching processes may be required for preparing these gate dielectric layers. However, with the shrinking of critical dimensions of the composite semiconductor structure, ICs are getting denser and the manufacturing process for forming the same are becoming more and more complicated. How to integrate the manufacturing processes of the various switching elements to reduce the manufacturing cost of the composite semiconductor structure has become an important issue in this technical field.

Therefore, there is a need of providing an advanced semiconductor structure and method for fabricating the same to obviate the drawbacks encountered from the prior art.

SUMMARY

One aspect of the present disclosure is to provide a semiconductor structure, wherein the semiconductor structure includes a substrate and a first switch element disposed in a first device area of the substrate. The first switch element includes a channel region, a first gate dielectric layer, a first gate layer and a source/drain region. The channel region is disposed at the bottom of a recess in the first device area. The first gate dielectric layer has a first region and a second region extending into the recess, the first region has a first thickness; the second region has a second thickness, and the first thickness is smaller than the second thickness. The first gate layer is disposed above the first gate dielectric layer. The source/drain region is disposed in the substrate and adjacent to the first gate dielectric layer.

Another aspect of the present disclosure is to provide a method for fabricating a semiconductor structure, wherein the method includes steps as follows: A recess is formed in a first device area of a substrate, and a channel region is formed at a bottom of the recess. Afterwards, a first gate dielectric layer having a first region and a second region is formed to extend into the recess. Wherein, the first region has a first thickness; the second region has a second thickness, and the first thickness is smaller than the second thickness. Next, a first gate layer is formed above the first gate dielectric layer; a source/drain region is then formed in the substrate and adjacent to the first gate dielectric layer.

Yet another aspect of the present disclosure is to provide a semiconductor structure, wherein the semiconductor structure includes a substrate, a first transistor and a second transistor. The first transistor is disposed on the substrate and includes a first gate oxide layer, wherein the first gate oxide layer includes a first region with a first thickness and a second region with a second thickness. The second transistor is disposed on the substrate and includes a second gate oxide layer with a third thickness. The second thickness is greater than the first thickness, and the first thickness is approximately equal to the third thickness.

In accordance with the aforementioned embodiments of the present disclosure, a semiconductor structure and a method for fabricating the same are provided, by which the processing steps for forming a first gate dielectric layer of a first switching element with a higher threshold voltage are integrated with the processing steps for forming a second gate dielectric layer of a second switching element with a lower threshold voltage, thereby the manufacturing process cost of the semiconductor structure can be reduced.

In addition, in the etching process for forming the first gate dielectric layer, the size and thickness of different regions in the first gate dielectric layer can be adjusted by controlling the coverage area of the photoresist to achieve the object of modulating the threshold voltage of the first switching element.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1A:
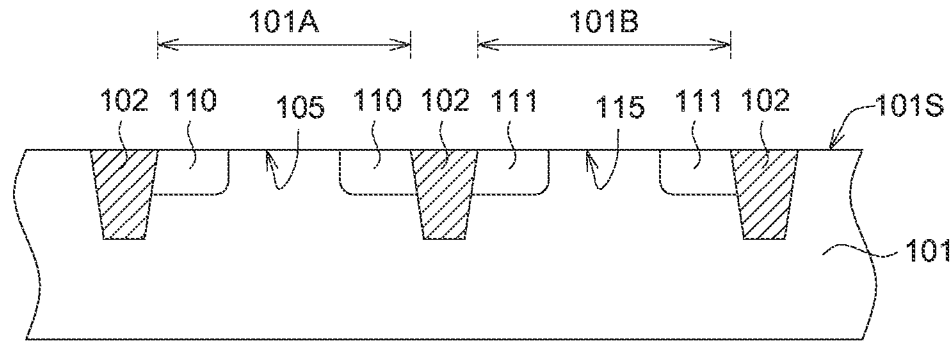
FIG. 1A to FIG. 1F are cross-sectional schematic diagrams illustrating a series of processing structures for fabricating a semiconductor structure according to one embodiment of the present disclosure.

The embodiments as illustrated below provide a semiconductor structure and a method for fabricating the same, which can integrate the processing steps for manufacturing various switching elements, so as to reduce the manufacturing cost thereof. The present disclosure will now be described more specifically with reference to the following embodiments illustrating the structure, method and arrangements thereof.

It is to be noted that the following descriptions of preferred embodiments of this disclosure are presented herein for purpose of illustration and description only. It is not intended to be exhaustive or to be limited to the precise form disclosed. Also, it is important to point out that there may be other features, elements, steps, and parameters for implementing the embodiments of the present disclosure which are not specifically illustrated. Thus, the descriptions and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1A to FIG. 1F are cross-sectional schematic diagrams illustrating a series of processing structures for fabricating a semiconductor structure 100 according to one embodiment of the present disclosure. The forming of the semiconductor structure 100 includes the following steps: Firstly, a substrate 101 is provided, and at least one insulating structure 102 is formed in the substrate 101, so as to at least define a first device area 101A and a second device area 101B in the substrate 101.

Next, at least one ion implantation process (not shown) is performed to form at least one lightly doped drain (LDD) region (such as the LDD region 110 and the LDD region 111) respectively in the first device area 101A and the second device area 101B of the substrate 101, so as to define a channel region (also referred as a drift region) 105 in the first device area 101A of the substrate 101, and to define a channel region 115 in the second device area 101B of the substrate 101 (as shown in FIG. 1A).

In some embodiments of the disclosure, the semiconductor substrate 101 may be made of silicon (Si), germanium (Ge), or compound semiconductor materials, such as gallium arsenide (GaAs). In the present embodiment, the substrate 101 is preferably a silicon wafer. The insulating structure 102 may be a shallow trench isolation structure (STI), extending downward into the substrate 101 from the substrate surface 101S of the substrate 101, so as to define the first device area 101A and the second device area 101B in the substrate 101.

Figure 1B:
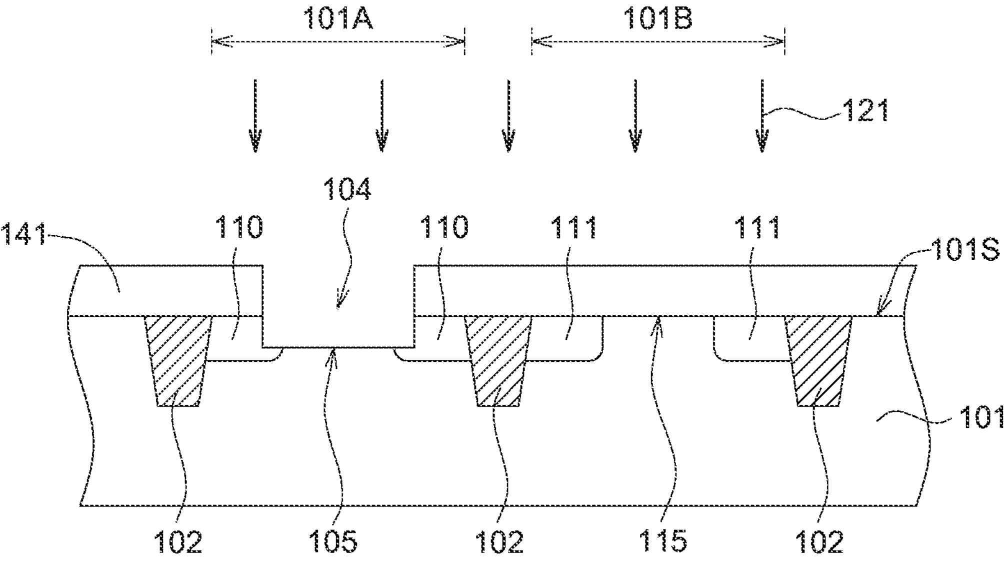

An etching process 121, using a patterned photoresist layer 141 as a mask, is then performed to form a recess 104 in the first device area 101A of the substrate 101, extending into the substrate 101 from the substrate surface 101S. Whereby, the channel region 105 that is disposed in the first device area 101A can be exposed outwards through the recess 104 (as shown in FIG. 1B).

Figure 1C:
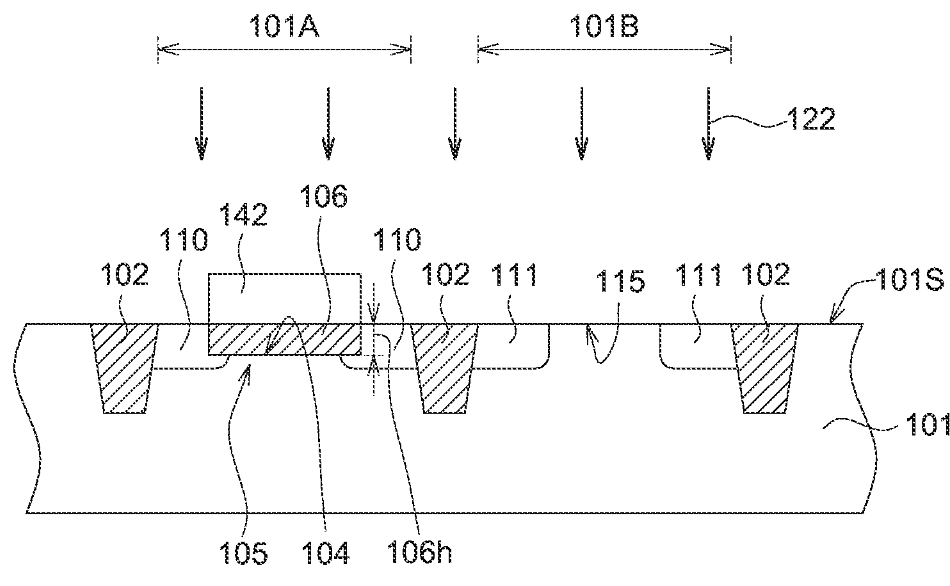

After stripping the patterned photoresist layer 141, a first gate dielectric layer 116 is formed to have a first region 116A and a second region 116B extending into the recess 104. In some embodiments of the present disclosure, the forming of the first gate dielectric layer 116 includes steps as follows: Firstly, a deposition process, such as a chemical vapor deposition (CVD) process or a physical vapor deposition (PVD) process, is performed to form a dielectric material layer 106 on the substrate 101 and cover the first device area 101A, the insulating structure 102 and the second device area 101B. The dielectric material layer 106 is then patterned by an etching process 122 using a patterned photoresist layer 142 as a mask. Wherein, the remaining portion of the dielectric material layer 106 is filled in the recess 104 (as shown in FIG. 1C). In the present embodiment, the dielectric material layer 106 may include silicon oxide (for example, silicon dioxide), silicon nitride, silicon oxynitride, or any combination thereof, or any other suitable dielectric material.

Figure 1D:
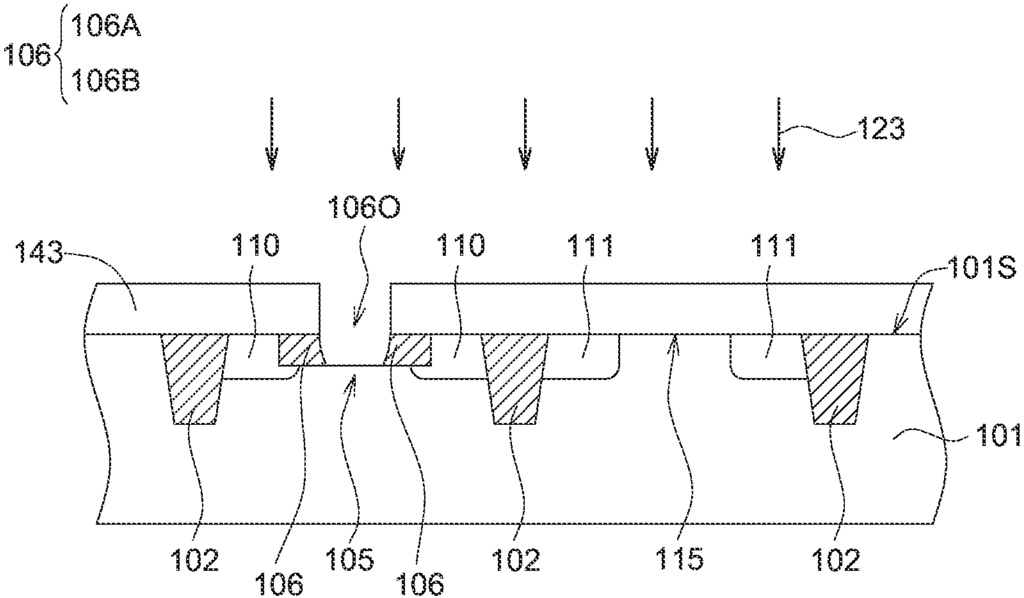

Afterwards, a patterned photoresist layer 143 is formed to cover the substrate 101 and only leave a portion of the first device area 101A (not covered) exposed outwards. And an etching process 123 is performed to remove the exposed portion of the dielectric material layer 106 that is disposed in the first device area 101A, so as to form an opening 1060 in the dielectric material layer 106. Such that, the part of the substrate 101 that is in the first device area 101A can be exposed again through the opening 1060. In the present embodiment, the exposed portion of the substrate 101 may be disposed near the middle of the first device area 101A (as shown in FIG. 1D). However, in another embodiment, exposed portion of the substrate 101 may be disposed near the periphery of the first device area 101A (not shown).

After stripping the patterned photoresist layer 143, a deposition process (not shown), such as a CVD process or a PVD process, is performed to form a dielectric material layer 108 on the substrate 101, covering the first device area 101A and the second device region 101B. Wherein, the material constituting the dielectric material layer 108 may be the same as or similar to the material constituting the dielectric material layer 106. In some embodiments, the dielectric material layer 108 may be formed on the exposed portion of the substrate 101 in the first device area 101A and the second device area 101B by a thermal oxidation process.

Figure 1E:
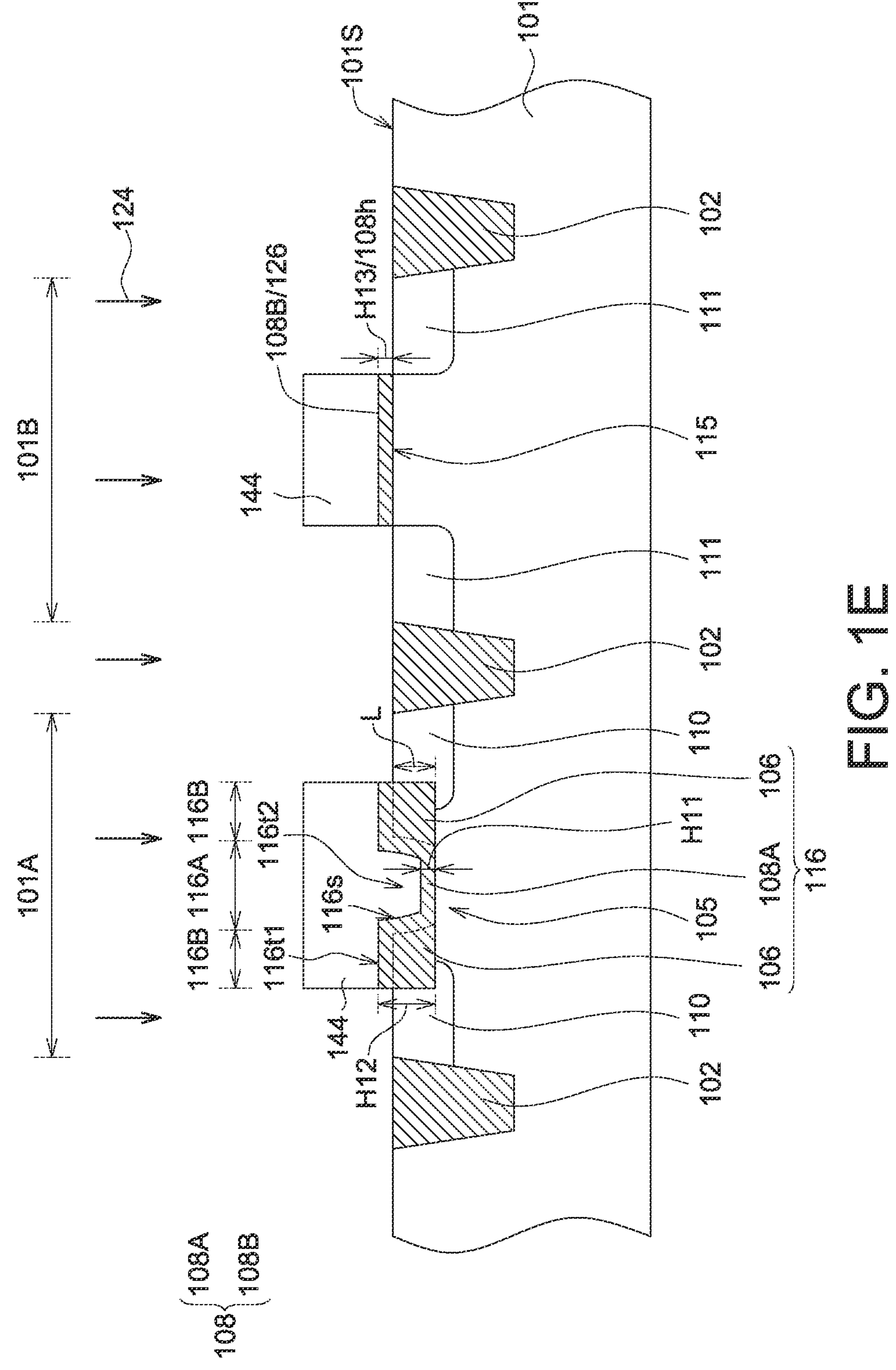

An etching process 124 using a patterned photoresist layer 144 as a mask is performed to pattern the dielectric material layer 108, whereby portions of the dielectric material layer (such as, the remained portions of the dielectric material layer 108A and 108B) are remained. Wherein, the remained portion of the dielectric material layer 108A covers a portion of the dielectric material layer 106 disposed in the first device area 101A and the portion of the substrate 101 exposed from the opening 1060; and the remained portion of the dielectric material layer 108B covers a portion of the substrate surface 101*s* disposed in the second device area 101B. In the present embodiment, the remained portion of the dielectric material layer 108A covering on the first device area 101A and a portion of the dielectric material layer 106 below the remained portion of the dielectric material layer 108A are combined to form the first gate dielectric layer 116. The remained portion of the dielectric material layer 108B covering on the second device area 101B forms a second gate dielectric layer 126 (as shown in FIG. 1E).

The first gate dielectric layer 116 can be divided into two parts, a first region 116A and a second region 116B. The first region 116A is formed by a part of the remained portion of the dielectric material layer 108A that fills the opening 1060 and contacts to the portion of the substrate 101 exposed from the opening 1060. The second region 116B is formed by the dielectric material layer 106 in combination with another part of the remained portion of the dielectric material layer 108A that contacts to the dielectric material layer 106. The first region 116A has a first thickness H11; the second region 116B has a second thickness H12, and the first thickness H11 is smaller than the second thickness H12. The remained portion of the dielectric material layer 108B disposed in the second device area 101B can serve as a portion of the second gate dielectric layer 126 and has a third thickness H13. That is, the second thickness H12 of the first gate dielectric layer 116 is substantially equal to the third thickness H13 of the second gate dielectric layer 126.

In the present embodiment, the first thickness H11 of the first region 116A of the first gate dielectric layer 116 is substantially equal to the initial thickness 108*h* of the dielectric material layer 108. The second thickness H12 of the second region 116B of the first gate dielectric layer 116 is substantially equal to the total thickness of the initial thickness 108*h* of the dielectric material layer 108 and the initial thickness 106*h* of the dielectric material layer 106. Wherein, the initial thickness 106*h* of the dielectric material layer 106 is about 180 angstroms (Å) to 220 Å; and the initial thickness 108*h* of the dielectric material layer 108 is about 10 Å to 20 Å.

In addition, the first region 116A of the first gate dielectric layer 116 has a first top surface 116$t$1; the second region 116B has a second top surface 116$t$2, and the first gate dielectric layer 116 includes an arc-shaped surface 116S connecting the first top surface 116$t$1 and the second top surface 116$t$2; the second top surface 116$t$2 of the second region 116B is higher than the substrate surface 101S of the substrate 101. In other words, the second thickness H12 of the second region 116B is substantially greater than the depth L1 of the recess 104.

Next, a first gate layer 109 and a gate spacer 113 are formed on the first gate dielectric layer 116; and an ion implantation process (not shown), using the first gate layer 109, the gate spacer 113 and the first gate dielectric layer 116 as a mask, is then perform to form a source/drain region 114 in the first device area 101A of the substrate 101, and adjacent to the first gate dielectric layer 116. The first gate layer 109, the gate spacer 113, the first gate dielectric layer 116 and the source/drain region 114 are combined to form a first switch element 131.

Meanwhile, a second gate layer 119 and a gate spacer 112 above the second gate dielectric layer 126 are formed; and another ion implantation process (not shown) using the second gate layer 119, the gate spacer 112 and the second gate dielectric layer 126 as a mask, is then performed to form a source/drain region 117 in the second device area 101B of the substrate 101, and adjacent to the second gate dielectric layer 126. The second gate layer 119, the gate spacer 112, the second gate dielectric layer 126 and the source/drain region 117 are combined to form a second switch element 132.

Figure 1F:
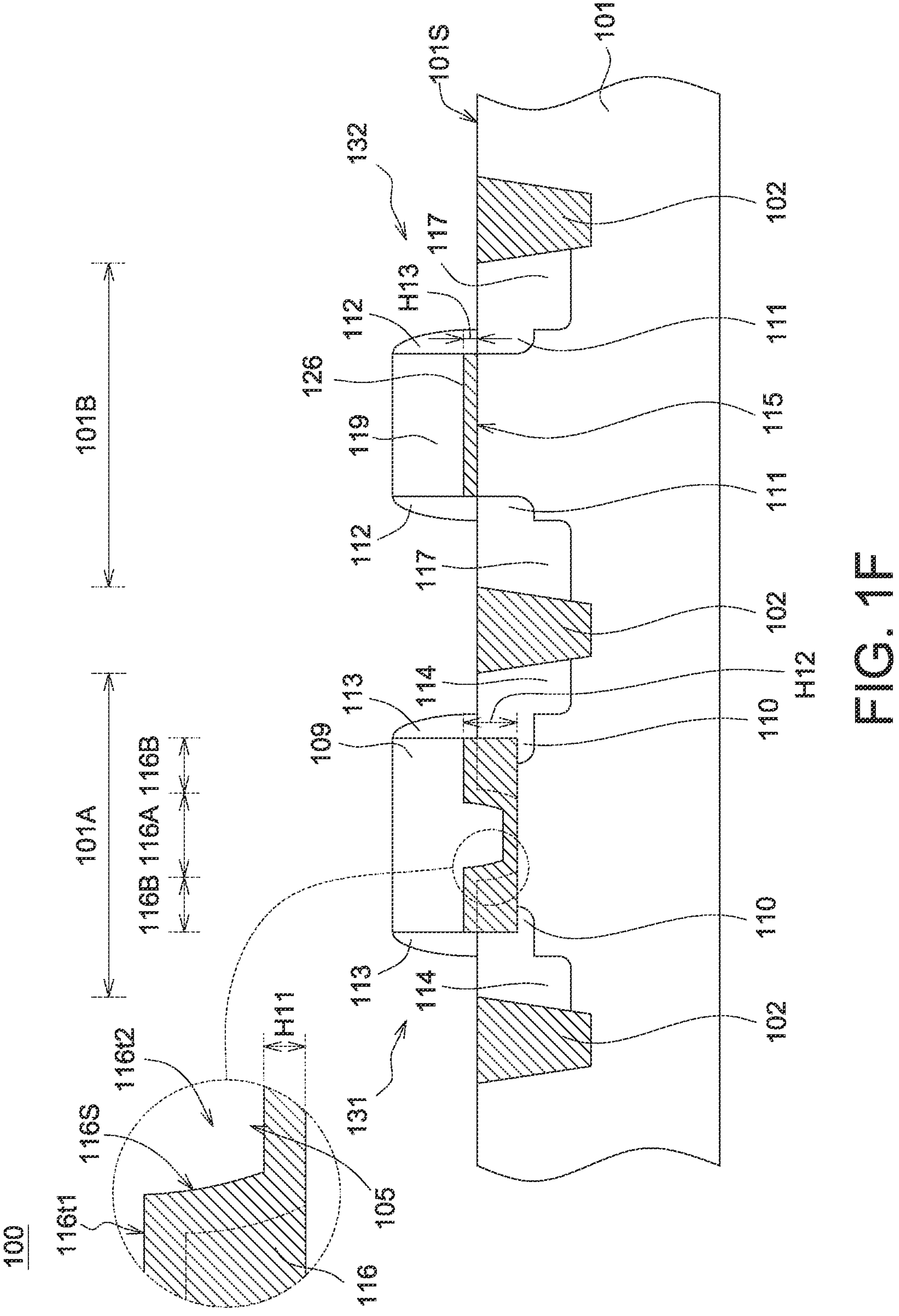

In the embodiment, the first switching element 131 may be a high voltage transistor, and the second transistor 132 may be a low voltage transistor (core device). The first gate layer 109 of the first switching element 131 may include a non-metal conductive material; the second gate layer 119 of the second transistor 132 may include a metal conductive material or a non-metal conductive material. Subsequently, after a series of downstream processes, an interconnection contact structure (not shown) is formed to electrically connect the first switching element 131 and the second switching element 132 respectively, and the preparation of the semiconductor structure 100 is completed (as shown in FIG. 1F).

Through the approach as mentioned above, the process steps for forming the first gate dielectric layer 116 of the first switching element 131 with a higher threshold voltage can be integrated with the process steps for forming the gate dielectric layer 126 of the second transistor 132 with a lower high threshold voltage. Thereby the process cost of the semiconductor structure 100 can be reduced. In addition, during the etching process of forming the first gate dielectric layer 116, the size and thickness of the first gate dielectric layer 116 in different regions can be adjusted by controlling the coverage of the patterned photoresist layer 143 for forming the opening 1060, so as to achieve the object of modulating the threshold voltage of the first switching element 131.

FIG. 2A to FIG. 2H are cross-sectional schematic diagrams illustrating a series of processing structures for fabricating a semiconductor structure 200 according to another embodiment of the present disclosure. The forming of the semiconductor structure 200 includes the following steps: Firstly, a substrate 201 is provided, and at least one insulating structure 202 is formed in the substrate 201, so as to define a first device area 201A, a second device area 201B and a third device area 201C in the substrate 201.

Figure 2A:
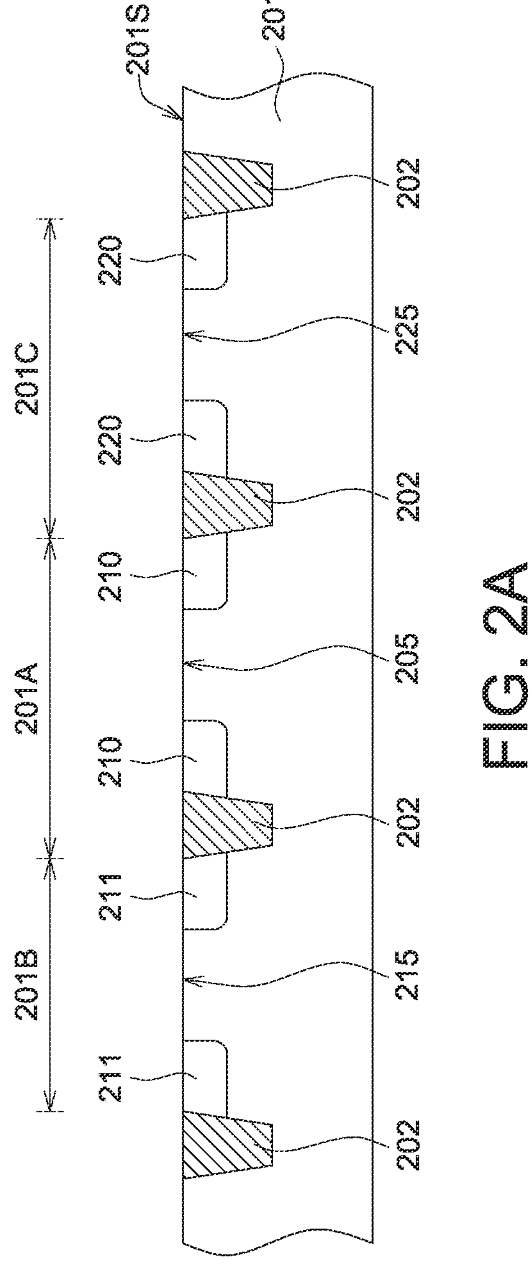
FIG. 2A to FIG. 2H are cross-sectional schematic diagrams illustrating a series of processing structures for fabricating a semiconductor structure according to another embodiment of the present disclosure.

Next, at least one ion implantation process (not shown) is performed to form at least one LDD region (such as the LDD regions 210, 211 and 220) respectively in the first device area 201A the second device area 201B and the third device area 201C of the substrate 201, so as to define channel regions 205, 215 and 225 respectively in the first device area 201A, the second device area 201B and the third device area 201C of the substrate 201 (as shown in FIG. 2A).

Figure 2B:
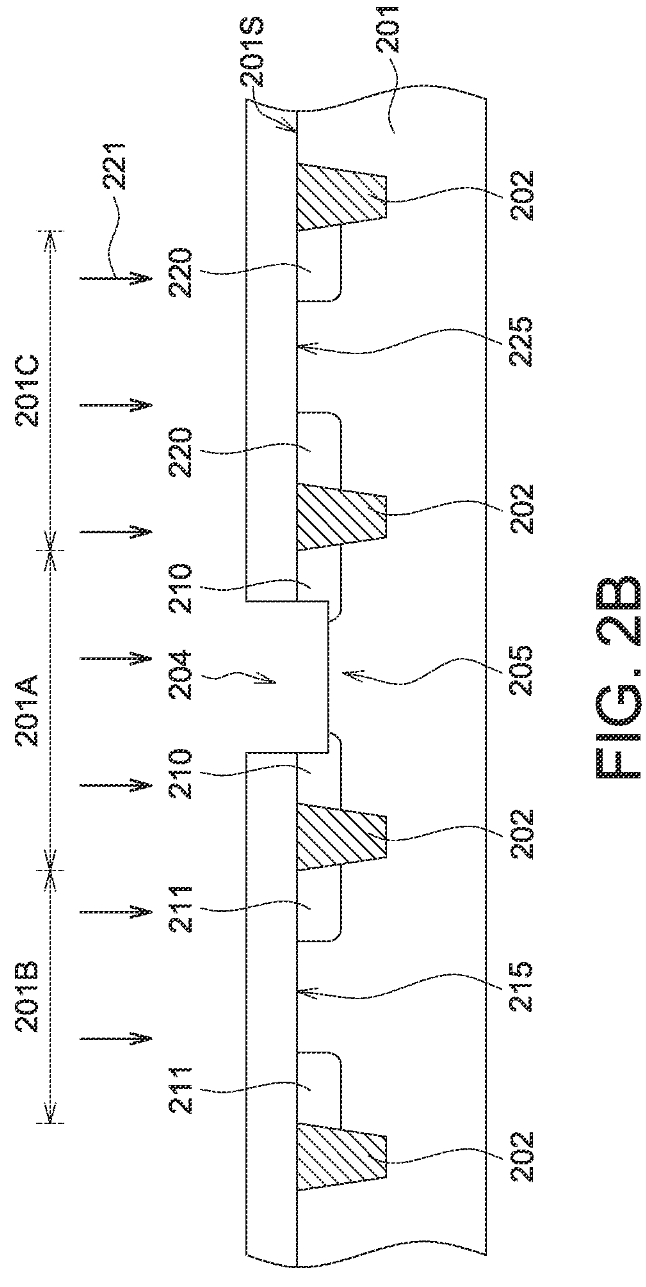

An etching process 221 using a patterned photoresist layer 241 as a mask is then performed to form a recess 204 in the first device area 201A of the substrate 201, extending into the substrate 201 from the substrate surface 201S. Whereby, a portion of the channel region 205 that is disposed in the first device area 201A can be exposed outwards through the recess 204 (as shown in FIG. 2B).

Figure 2C:
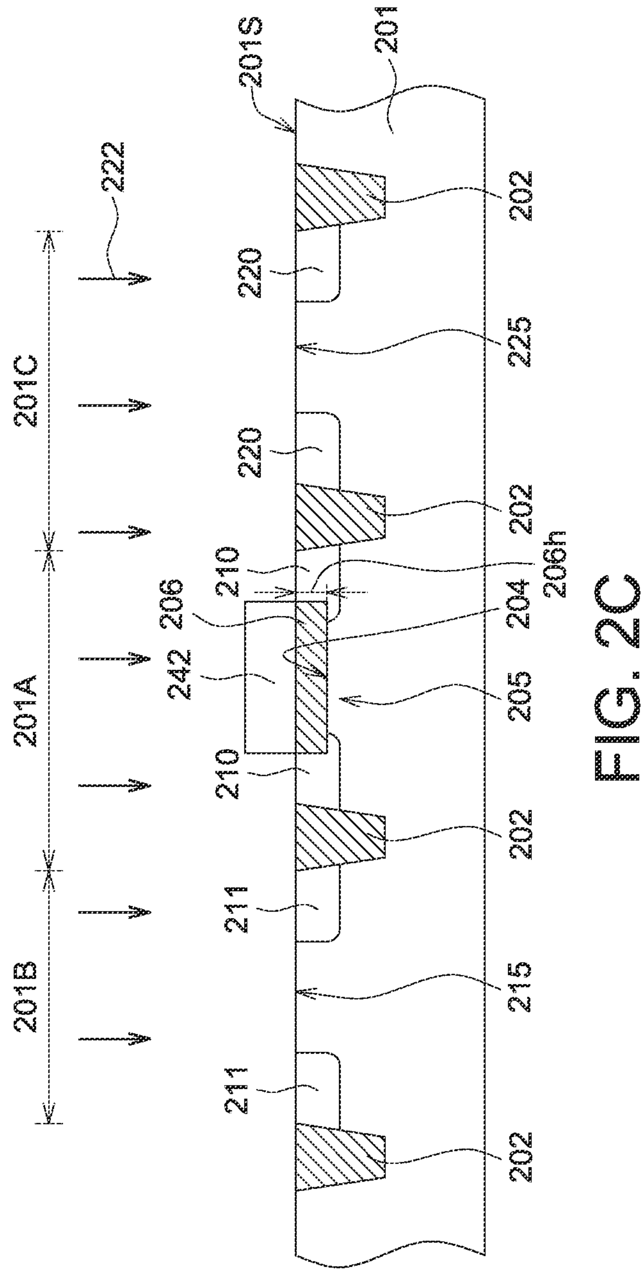

After stripping the patterned photoresist layer 241, a first gate dielectric layer 216 is formed to have a first region 216A and a second region 216B extending into the recess 204. In some embodiments of the present disclosure, the forming of the first gate dielectric layer 216 includes steps as follows: Firstly, a deposition process, such as a CVD process or a PVD process, is performed to form a dielectric material layer 206 on the substrate 201 and cover the first device area 201A, the insulating structure 202, the second device area 201B and the third device area 201C. The dielectric material layer 206 is then patterned by an etching process 222 using a patterned photoresist layer 242 as a mask. Wherein, the remaining portion of the dielectric material layer 206 is filled in the recess 204 (as shown in FIG. 2C). In the present embodiment, the dielectric material layer 206 may include silicon oxide (for example, silicon dioxide), silicon nitride, silicon oxynitride, or any combination thereof, or any other suitable dielectric material. The initial thickness 206$h$ of the dielectric material layer 206 is 180 Å to 220 Å.

Figure 2D:
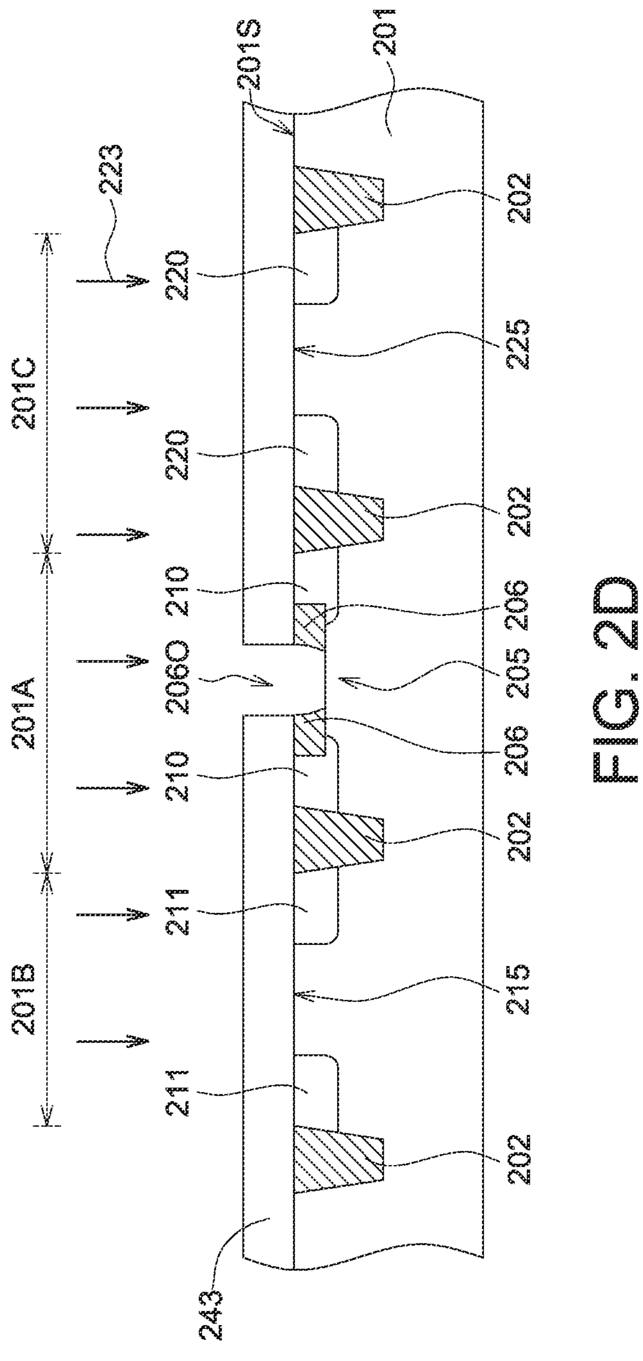

After stripping the patterned photoresist layer 242, a patterned photoresist layer 243 is formed to cover the substrate 201 and only leave a portion of the first device area 201A (not covered) exposed outwards. And an etching process 223 is performed to remove the exposed portion of the dielectric material layer 206 that is disposed in the first device area 201A, so as to form an opening 2060 in the dielectric material layer 206. Such that, the part of the substrate 201 that is in the first device area 201A can be exposed again through the opening 2060 (as shown in FIG. 2D).

Figure 2E:
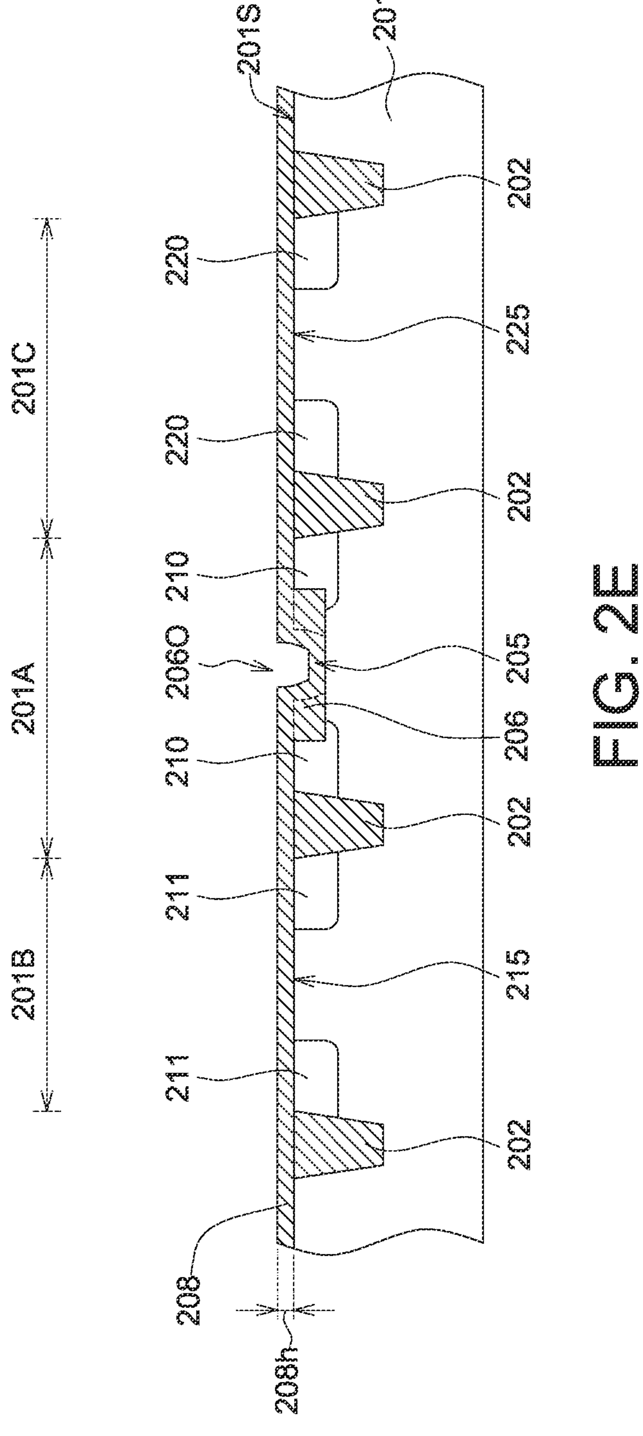

After stripping the patterned photoresist layer 243, a deposition process (not shown), such as a CVD process or a PVD process, is performed to form a dielectric material layer 208 on the substrate 201 to fill the opening 2060 disposed in the first device area 201A, and cover portions of the substrate 201 that are exposed from the second device area 201B and the third device area 201C (as shown in FIG. 2E). Wherein, the material constituting the dielectric material layer 208 may be the same as or similar to the material constituting the dielectric material layer 206. The initial thickness 208$h$ of the dielectric material layer 208 is 15 Å to 25 Å.

Figure 2F:
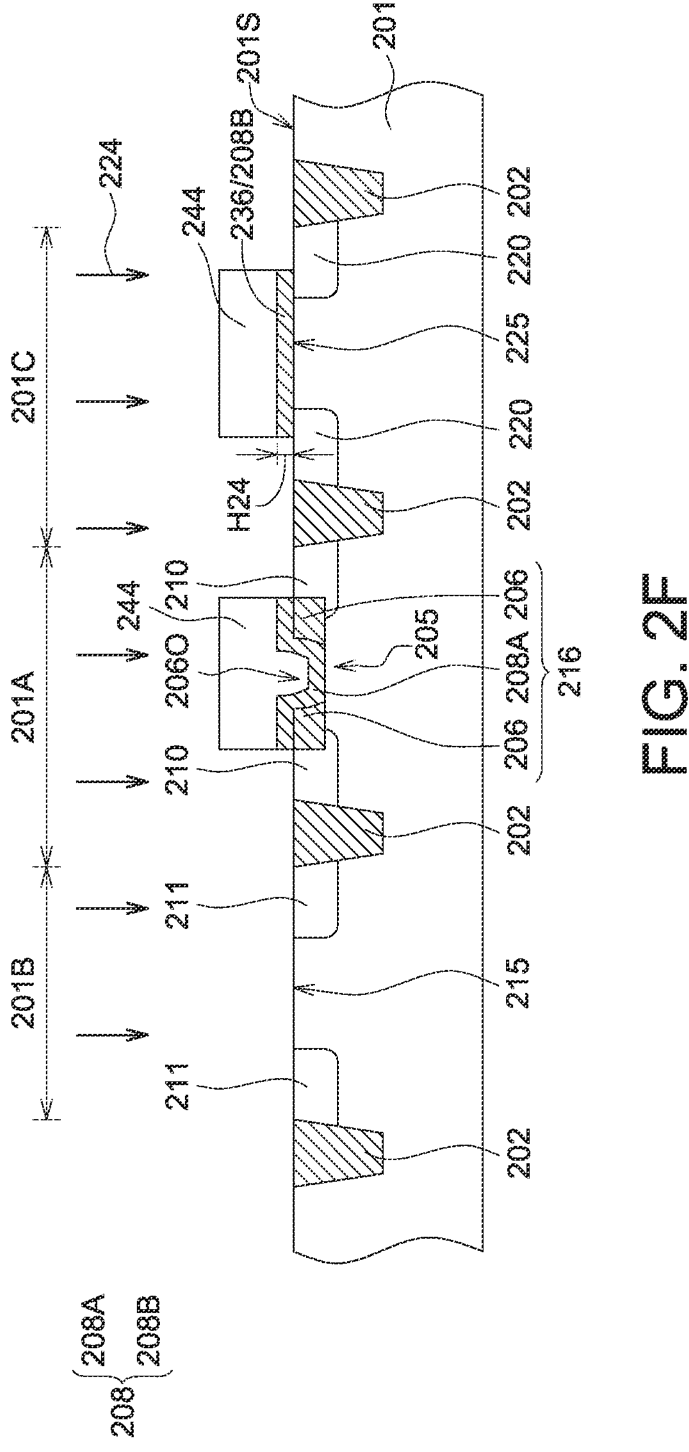

Afterwards, a patterned photoresist layer 244 is formed to cover portions of the first device area 201A and the third device area 201C, so as to expose the second device area 201B. Then a patterning process 224 is performed to remove the portion of the dielectric material layer 208 disposed on the second device area 201B, to make the portion of the substrate 101 that is in the first device area 101A exposed again. Such that, the remained portion of the dielectric material layer 208A covers the first device area 201A, fills the opening 2060, and is combined with the portion of the dielectric material layer 206 below it to form the first gate dielectric layer 216. The other remained portion of the dielectric material layer 208B covers a portion of the substrate surface 201S disposed in the third device area 201C, and serves as a third gate dielectric layer 236 (as shown in FIG. 2F). In the present embodiment, the fourth thickness H24 of the third gate dielectric layer 236 is substantially equal to the initial thickness 208*h* of the dielectric material layer 208, which is about 15 Å to 25 Å.

After that, a patterned photoresistis formed serving as a mask to cover portions of the first device area 201A and the third device area 201C, but not cover (expose) a portion of the second device area 201B. Then, a deposition process (not shown), such as a CVD process or a PVD process, is performed to form a dielectric material layer 228 covering the portions of the patterned photoresist layer 245 disposed in the first device area 201A and the second device area 201B, and covering a portion of the substrate 201 disposed in the second device area 201B (as shown in FIG. 2G).

Figure 2G:
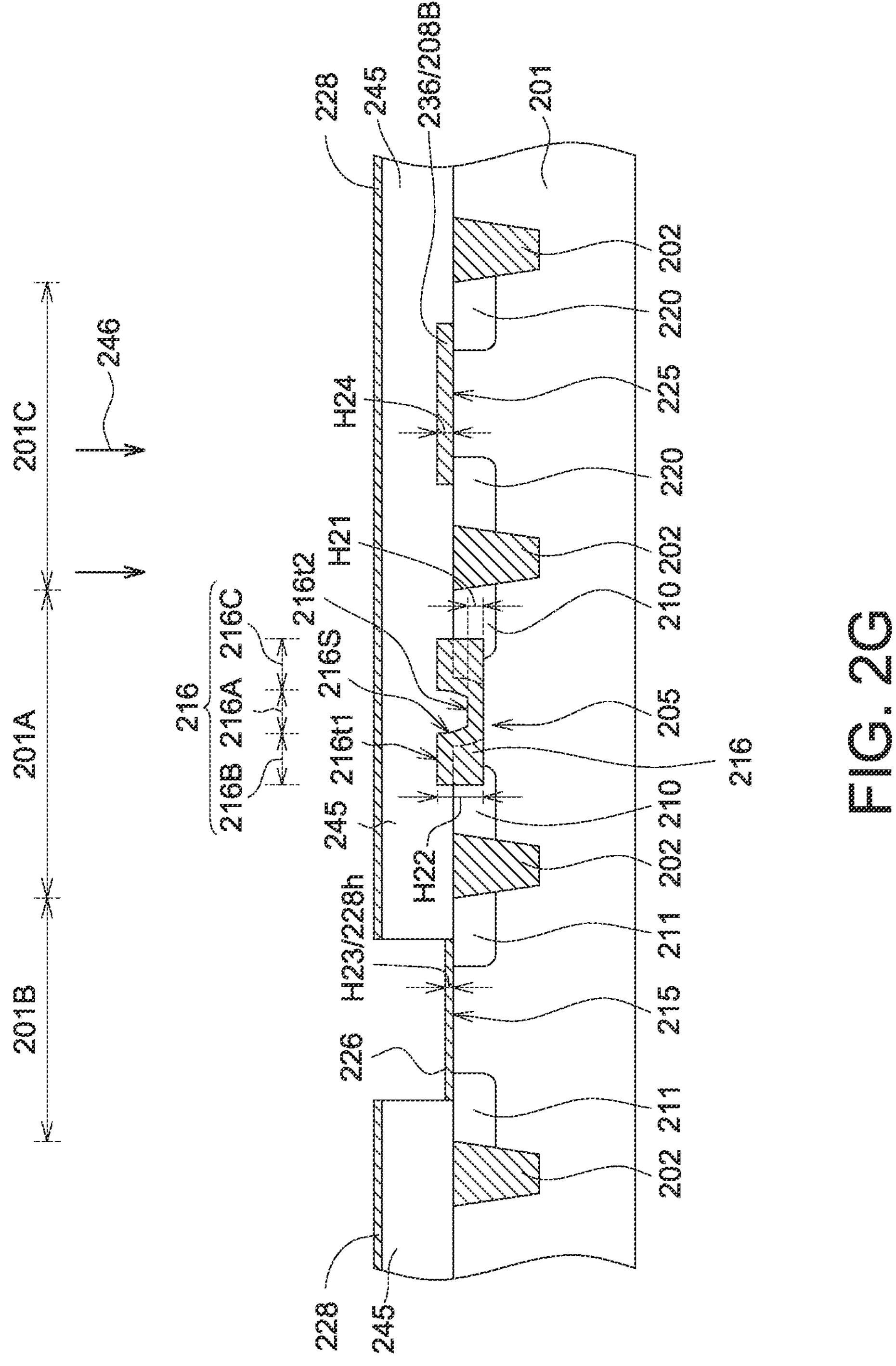

In the present embodiment, the portion of the dielectric material layer 228 that is disposed in the second device area 201B and covers on the exposed portion of the substrate surface 201S can serve as the second gate dielectric layer 226 (as shown in FIG. 2G). The material constituting the dielectric material layer 228 may be the same or similar to the material constituting the dielectric material layer 206 or the dielectric material layer 208; and the initial thickness 228*h* of the dielectric material layer 228 is about 5 Å to Å.

The first gate dielectric layer 216 can be divided into two parts, a first region 216A and a second region 216B. The first region 216A is formed by a part of the remained portion of the dielectric material layer 208A that fills the opening 2060 and contacts to the portion of the substrate 201 exposed from the opening 2060. The second region 216B is formed by the dielectric material layer 206 in combination with another part of the remained portion of the dielectric material layer 208A that contacts to the dielectric material layer 206. The first region 216A has a first thickness H21; the second region 216B has a second thickness H22, and the first thickness H21 is smaller than the second thickness H22. The second gate dielectric layer 226 has a third thickness H23. The first thickness H22 is substantially equal to the fourth thickness H24.

In this embodiment, the first thickness H21 of the first region 216A is substantially equal to the initial thickness 208*h* of the dielectric material layer 208. The second thickness H22 of the second region 216B is substantially equal to the total thickness of the initial thickness 208*h* of the dielectric material layer 208 and the initial thickness 206*h* of the dielectric material layer 206.

In addition, the first region 216A of the first gate dielectric layer 216 has a first top surface 216*t*1; the second region 216B has a second top surface 216*t*2, and the first gate dielectric layer 216 includes an arc surface 216*s* connects the first top surface 216*t*1 and the second top surface 216*t*2; the second top surface 216*t*2 of the second region 216B is higher than the substrate surface 201S of the substrate 201. In other words, the second thickness H22 of the second region 216B is substantially greater than the depth L2 of the recess 204.

After stripping the patterned photoresist layer 245, a first gate layer 209 and a gate spacer 213 are formed on the first gate dielectric layer 216; and an ion implantation process (not shown), using the first gate layer 209, the gate spacer 213 and the first gate dielectric layer 216 as a mask, is then perform to form a source/drain region 214 in the first device area 201A of the substrate 201, and adjacent to the first gate dielectric layer 216. The first gate layer 209, the gate spacer 213, the first gate dielectric layer 216 and the source/drain region 214 are combined to form a first switch element 231.

Meanwhile, a second gate layer 219 and a gate spacer 234 above the second gate dielectric layer 226 are formed; and another ion implantation process (not shown) using the second gate layer 219, the gate spacer 234 and the second gate dielectric layer 226 as a mask, is then performed to form a source/drain region 217 in the second device area 201B of the substrate 201, and adjacent to the second gate dielectric layer 226. The second gate layer 219, the gate spacer 234, the second gate dielectric layer 226 and the source/drain region 217 are combined to form a second switch element 232.

And a third gate layer 229 and a gate spacer 235 are formed above the third gate dielectric layer 236. Another ion implantation process (not shown), using the third gate layer 229, the gate spacer 235 and the third gate dielectric layer 236 as a mask, is then performed to form a source/drain region 227 in the third device area 201C of the substrate 201, and adjacent to the third gate dielectric layer 236. The third gate layer 229, the gate spacer 235, the third gate dielectric layer 236 and the source/drain region 227 are combined to form a third switch element 233 (as shown in FIG. 2F).

Figure 2H:
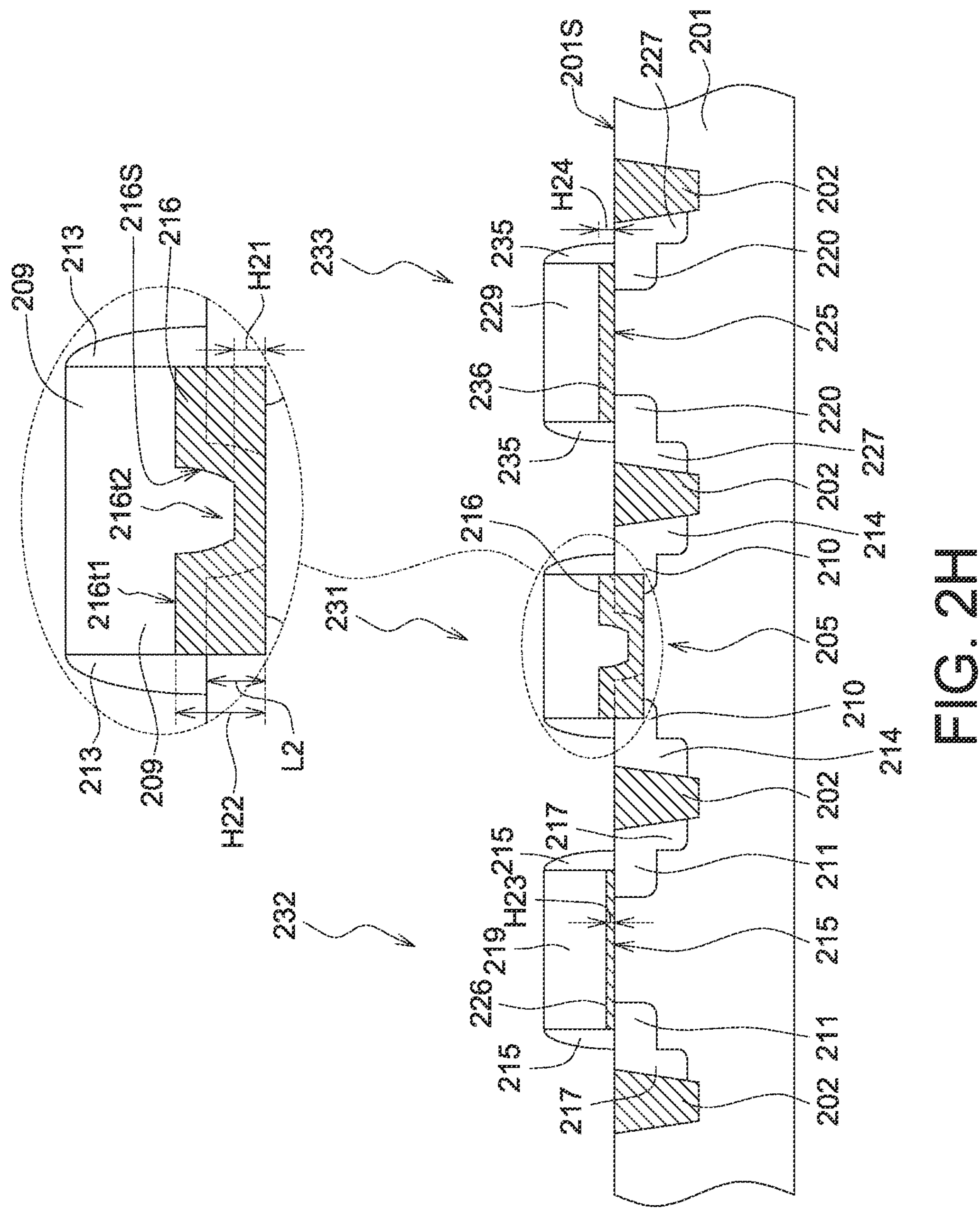

In the present embodiment, the first switching element 231 may be a high voltage transistor, the second transistor 232 may be a low voltage transistor, and the third switching element 233 may be an output/input (I/O) transistor device. The first gate layer 209 of the first switching element 231 may include a non-metal conductive material. At least one of the second gate layer 219 of the second transistor 232 and the third gate layer 229 of the third switch element 233 may include metal conductive material or non-metal conductive material. Subsequently, after a series of downstream processes, an interconnection contact structure (not shown) is formed to electrically connect the first switching element 231, the second switching element 232 and the third switch element 233 respectively, and the preparation of the semiconductor structure 200 is completed (as shown in FIG. 2H).

Through the approach as mentioned above, the process steps for forming the first gate dielectric layer 216 of the first switching element 231 with a higher threshold voltage can be integrated with the process steps for forming the gate dielectric layer 226 of the second switching element 232 and the third gate layer 229 of the third switch element 233 both, wherein the second switching element 232 and the third switch element 233 both have lower high threshold voltages. Thereby the process cost of the semiconductor structure 200 can be reduced. In addition, during the etching process of forming the first gate dielectric layer 216, the size and thickness of the first gate dielectric layer 216 in different regions can be adjusted by controlling the coverage of the patterned photoresist layer 243 for forming the opening 2060, so as to achieve the object of modulating the threshold voltage of the first switching element 231.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:

a substrate; and a first switch element, disposed in a first device area of the substrate, comprising:

a channel region, disposed at a bottom of a recess in the first device area;

a first gate dielectric layer, having a first region and a second region extending into the recess; wherein the first region is disposed near a middle of the first device area and has a first thickness; the second region is disposed near a periphery of the first device area and has a second thickness; the first thickness is smaller than the second thickness; and the second thickness is greater than a depth of the recess;

a first gate layer, disposed above the first gate dielectric layer; and a source/drain region, disposed in the substrate and adjacent to the first gate dielectric layer.

2. The semiconductor structure according to claim 1, wherein the recess extends into the substrate from a substrate surface; and the first region has a first top surface lower than the substrate surface of the substrate.

3. The semiconductor structure according to claim 2, wherein the second region has a second top surface; and the first gate dielectric layer comprises an arc surface connecting the first top surface and the second top surface.

4. The semiconductor structure according to claim 3, wherein the second top surface is higher than the substrate surface.

5. The semiconductor structure according to claim 2, further comprises a second switch element disposed in a second device area of the substrate, wherein the second switch element comprises a second gate dielectric layer that has a material the same to that of the first gate dielectric layer and the first thickness.

6. A method for fabricating a semiconductor structure, comprising:

forming a recess in a first device area of a substrate;

forming a channel region at a bottom of the recess;

forming a first gate dielectric layer having a first region and a second region to extend into the recess, wherein the first region is disposed near a middle of the first device area and has a first thickness; the second region is disposed near a periphery of the first device area, extend upward higher than a substrate surface of the substrate and has a second thickness, the first thickness is smaller than the second thickness; and the second thickness is greater than a depth of the recess;

forming a first gate layer above the first gate dielectric layer; and forming a source/drain region in the substrate and adjacent to the first gate dielectric layer.

7. The method according to claim 6, wherein the step of forming the first gate dielectric layer comprises:

forming a first dielectric material layer having an initial thickness and extending into the recess;

etching the first dielectric material layer to remove a portion of the first dielectric material layer disposed in the first region to form an opening; and forming a second dielectric material layer at least covering the first region.

8. The method according to claim 7, wherein the step of forming the recess in the substrate comprises performing an etching process to remove a portion of the substrate, so as to form the recess extending downward into the substrate from the substrate surface of the substrate.

9. The method according to claim 8, wherein after the second dielectric material layer is formed, a portion of the second dielectric material layer disposed in the first region has a first top surface lower than the substrate surface; a portion of the second dielectric material layer disposed in the second region has a second top surface higher than the substrate surface.

10. The method according to claim 7, wherein the step of etching the first dielectric material layer comprises removing the portion of the first dielectric material layer disposed in the first region to make a portion of the substrate exposed from the opening.

11. The method according to claim 10, wherein the first thickness is equal to a thickness of the second dielectric material layer, and the second thickness is equal to a total thickness of the first dielectric material layer and the second dielectric material layer.

12. The method according to claim 6, wherein a portion of the second dielectric material layer covers a second device area of the substrate and serves as a second gate dielectric layer of a second switch element.

13. A semiconductor structure, comprising:

a substrate and a first transistor, disposed in the substrate, and comprising a first gate dielectric layer and a first gate layer, wherein the first gate dielectric layer has a first region with a first thickness and a second region with a second thickness; wherein the first gate layer at least partially extends downward into a recess formed in the substrate from a substrate surface of the substrate; and a second transistor, disposed in the substrate, and comprising a second gate dielectric layer with a third thickness;

wherein the second thickness is greater than the first thickness; and the second thickness is greater than a depth of the recess.

14. The semiconductor structure according to claim 13, wherein the first transistor is a high voltage transistor; and the second transistor is a low voltage transistor or a core device.

15. The semiconductor structure according to claim 13, wherein the third thickness of the second gate dielectric layer is less than or equal to 15 angstrom (Å).

16. The semiconductor structure according to claim 13, wherein the first transistor is a high voltage transistor; the second transistor is an I/O device; and the third thickness is less than or equal to 25 Å.

17. The semiconductor structure according to claim 13, wherein the first transistor has a source/drain region, the second transistor has a lightly doped drain (LDD) region.

18. The semiconductor structure according to claim 13, wherein the first transistor has a first gate layer, the second transistor has a second gate layer; the first gate layer and the second gate layer both comprise a metal conductive material or both comprise a non-metal conductive material.

19. The semiconductor structure according to claim 13, wherein the first transistor has a first gate layer, the second transistor has a second gate layer; the first gate layer comprises a non-metal conductive material; and the second gate layer comprises a metal conductive material.

20. The semiconductor structure according to claim 13, wherein the second gate dielectric layer of the second transistor has a top surface higher than a substrate surface of the substrate.

* * * * *